(12) United States Patent
Zimmer et al.

(10) Patent No.: US 10,724,844 B2
(45) Date of Patent: Jul. 28, 2020

(54) MULTI-TURN COUNTER SENSOR

(71) Applicant: Infineon Technologies AG, Neubiberg (DE)

(72) Inventors: Jürgen Zimmer, Neubiberg (DE); Sebastian Luber, Oberschleißheim (DE); Thomas Bever, Munich (DE); Hansjoerg Walter Kuemmel, Munich (DE); Christian Kegler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 110 days.

(21) Appl. No.: 15/866,206

(22) Filed: Jan. 9, 2018

(65) Prior Publication Data

US 2019/0195613 A1    Jun. 27, 2019

Related U.S. Application Data

(60) Provisional application No. 62/609,695, filed on Dec. 22, 2017.

(51) Int. Cl.
| | |
|---|---|
| *G01B 7/30* | (2006.01) |
| *G01D 5/14* | (2006.01) |
| *G01R 33/09* | (2006.01) |
| *G01D 5/16* | (2006.01) |
| *G01D 5/06* | (2006.01) |

(52) U.S. Cl.
CPC .............. *G01B 7/30* (2013.01); *G01D 5/142* (2013.01); *G01R 33/091* (2013.01); *G01D 5/06* (2013.01); *G01D 5/16* (2013.01)

(58) Field of Classification Search
CPC ........ G01B 7/30; G01R 33/09; G01R 33/091; G01R 33/093; G01R 33/095; G01R 33/096; G01R 33/098
See application file for complete search history.

(56) References Cited

U.S. PATENT DOCUMENTS

| | | |
|---|---|---|
| 8,179,130 B2 | 5/2012 | Mattheis |
| 2005/0237054 A1 | 10/2005 | Halder et al. |
| 2007/0285087 A1 | 12/2007 | Diegel et al. |
| 2009/0058402 A1* | 3/2009 | Zimmer ................. G01P 3/487 324/207.21 |

(Continued)

FOREIGN PATENT DOCUMENTS

| | | |
|---|---|---|
| DE | 102010022611 | 2/2015 |
| EP | 1740909 | 6/2007 |
| EP | 1532425 | 9/2007 |

*Primary Examiner* — David M Schindler
(74) *Attorney, Agent, or Firm* — Harrity & Harrity, LLP

(57) ABSTRACT

An example multi-turn counter (MTC) sensor includes a magnetic strip that includes a domain wall generator located at a first end of the magnetic strip, where the domain wall generator is to generate at least one domain wall in the magnetic strip, the at least one domain wall configured to propagate based on a magnetic field caused by a magnet; wherein a location of the at least one domain wall indicates a turn count of the magnetic field of the magnet; the turn count to indicate one or more of a predefined fraction of a full rotation of the magnetic field; an end tip located at a second end of the magnetic strip, where the second end of the magnetic strip is opposite the first end; and a plurality of overlapping strip turns that cause a plurality of crossings in the magnetic strip.

20 Claims, 10 Drawing Sheets

(56) References Cited

U.S. PATENT DOCUMENTS

| | | | |
|---|---|---|---|
| 2009/0295381 A1* | 12/2009 | Theuss | G01R 33/0005 |
| | | | 324/252 |
| 2016/0265941 A1 | 9/2016 | Mattheis et al. | |
| 2017/0261345 A1* | 9/2017 | Schmitt | G01D 5/16 |
| 2018/0172477 A1* | 6/2018 | Dietrich | G01D 5/145 |
| 2018/0216965 A1* | 8/2018 | Richard | G01D 5/165 |
| 2018/0372510 A1* | 12/2018 | Mattheis | G01P 3/487 |

* cited by examiner

US 10,724,844 B2

MULTI-TURN COUNTER SENSOR

RELATED APPLICATION

This application claims priority under 35 U.S.C. § 119 to U.S. Provisional Patent Application No. 62/609,695, filed on Dec. 22, 2017, the content of which is incorporated by reference herein in its entirety.

BACKGROUND

A multi-turn counter (MTC) sensor may be used to determine a number of turns of an external rotating magnetic field (e.g., a number of full or partial rotations of the magnetic field) produced by a magnet (e.g., a magnet attached to or formed as part of a rotatable object). The MTC sensor may be a magnetoresistive (MR)-based sensor (e.g., a tunnel magnetoresistive (TMR) sensor, a giant magnetoresistive (GMR) sensor). In some instances, the MTC sensor may include a domain wall generator that generates a domain wall on a magnetized strip of the MTC sensor. The location of the domain wall on the magnetic strip of MTC sensor may be used to count the number of turns of the external magnetic field.

SUMMARY

According to some implementations, a multi-turn counter (MTC) sensor may include a magnetic strip that includes a domain wall generator located at a first end of the magnetic strip, where the domain wall generator is to generate at least one domain wall in the magnetic strip, the at least one domain wall configured to propagate based on a magnetic field caused by a magnet; wherein a location of the at least one domain wall indicates a turn count of the magnetic field of the magnet; the turn count to indicate one or more of a predefined fraction of a full rotation of the magnetic field; an end tip located at a second end of the magnetic strip, where the second end of the magnetic strip is opposite the first end; and a plurality of overlapping strip turns that cause a plurality of crossings in the magnetic strip.

According to some implementations, a multi-turn counter (MTC) sensor may include a magnetic strip that includes a domain wall generator located at a first end of the magnetic strip, where the domain wall generator is to generate at least one domain wall in the magnetic strip, the at least one domain wall configured to propagate based on a magnetic field caused by a magnet, wherein a location of the at least one domain wall indicates a turn count of the magnetic field of the magnet; the turn count to indicate one or more of a predefined fraction of a full rotation of the magnetic field; an end tip located at a second end of the magnetic strip, where the second end of the magnetic strip is opposite the first end, and a plurality of phase delaying bends to cause a delay of propagation the at least one domain wall with regard to an orientation of the external magnetic field based on a rotation of the external magnetic field.

According to some implementations, a multi-turn counter (MTC) sensor may include a magnetic strip that includes a domain wall generator located at a first end of the magnetic strip; an end tip located at a second end of the magnetic strip, where the second end of the magnetic strip is opposite the first end, and a plurality of turns between the domain wall generator and the end tip; and an integrated magnetic concentrator (IMC) layer configured between at least a part of the magnetic strip and a magnet that causes a magnetic field, wherein the IMC is to reduce a strength of the magnetic field to enable the MTC sensor to count a number of rotations of the magnet based on detecting movement of domain walls in the magnetic strip caused by the magnetic field.

DETAILED DESCRIPTION

Figure 1A:
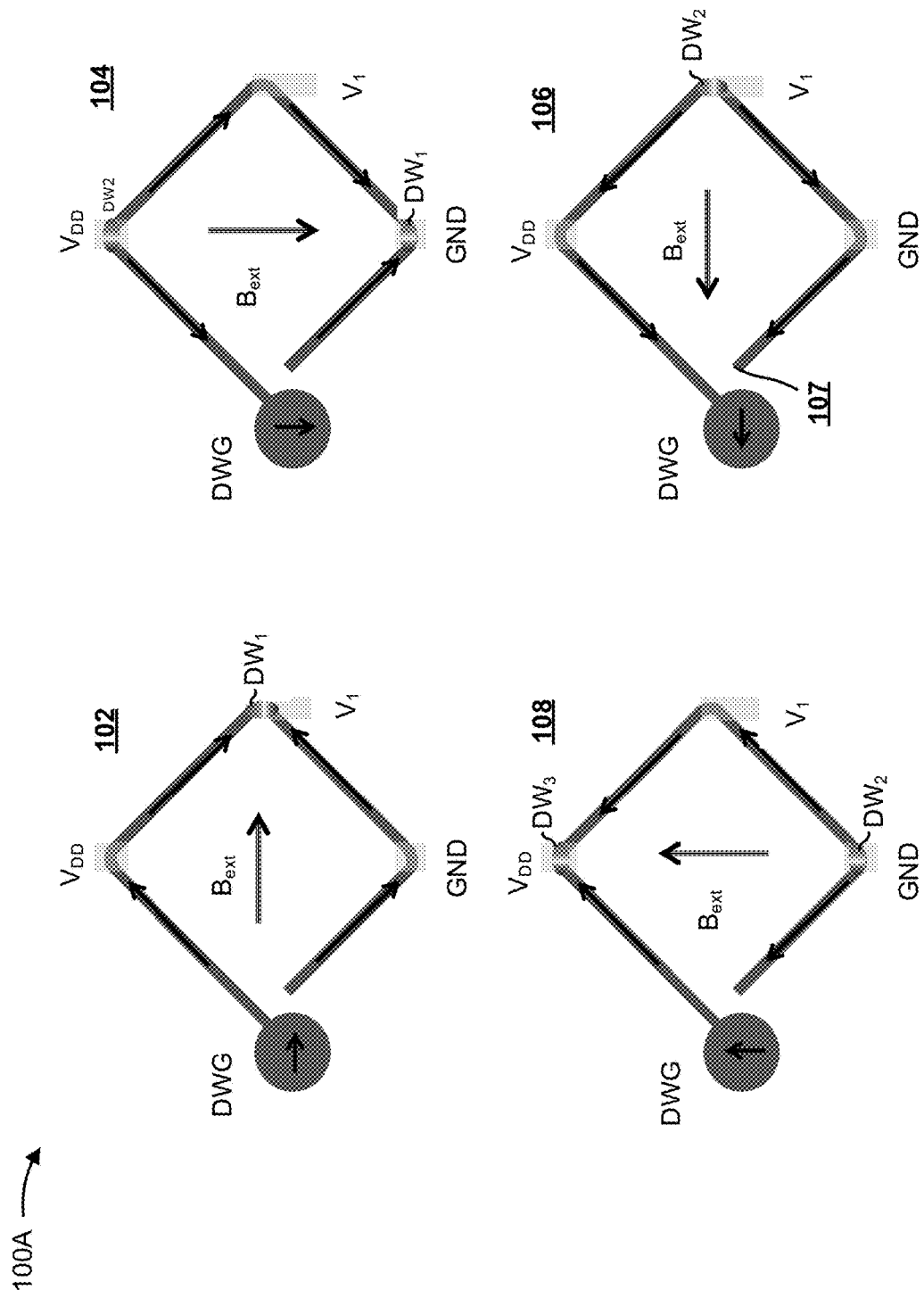
FIGS. 1A-1D are diagrams of an overview of example implementations described herein.

The following detailed description of example implementations refers to the accompanying drawings. The same reference numbers in different drawings may identify the same or similar elements.

In some instances, an MTC sensor, such as an MR-based angle sensor, may include a magnetic strip and a domain wall generator (DWG) to generate a domain wall on the magnetic strip. The DWG may include a conductive material attached to or formed as part of the magnetic strip. In some cases, the DWG may have a larger dimension (e.g., a larger width or diameter) than a dimension (e.g., a width) of the magnetic strip. The DWG may generate a domain wall within the magnetic strip to enable the MTC sensor to determine a turn count of a rotatable object. For example, based on the location of the domain wall within the magnetic strip and/or a direction of a magnetic field of a magnet connected to the rotatable object, the MTC sensor may determine the turn count. As used herein, turn count may refer to a number of turns (e.g., in either direction (clockwise or counter-clockwise)) from an originating position. In some implementations, a turn count may indicate one or more of a predefined fraction of a full rotation of a magnetic field sensed by the MTC sensor. In some implementations, a turn count may be configured to indicate one or more full rotations of the magnetic field in terms of a further predefined multiplicity of the predefined fractions. Accordingly, a turn count may be two turns counter-clockwise, one and a half turns clockwise, etc.

In some instances, a magnetic strip of an MTC sensor may be formed to include the DWG at one end of the magnetic strip and an end tip at an end of the magnetic strip opposite the DWG. In such instances, shape anisotropy of the magnetic strip, in particular at the end tip (e.g., due to manufacturing tolerances), may inhibit the MTC sensor from accurately sensing and/or counting turns of an external magnetic field sensed by the MTC sensor. For example, imperfections and/or inhomogeneity of the magnetic strip may interfere with expected movement of a domain wall along the magnetic strip corresponding to movement of an external magnetic field, thus resulting in an inaccurate or an indeterminable turn count of an external magnetic field.

Some implementations described herein provide an MTC sensor with an integrated magnetic concentrator (IMC) layer to account for imperfections and/or inhomogeneity of the magnetic strip. The IMC layer may reduce a likelihood of a generation of domain walls at unexpected locations, such as at the end tip of the magnetic strip (due to shape anisotropy of the end tip), thus enabling increased accuracy in determining the turn count. In some implementations, the IMC layer in the MTC sensor may be configured to be situated between a magnet and an end tip of the magnetic strip, over a portion of the magnetic strip (e.g., a portion that does not include the DWG), and/or over the entire magnetic strip.

Furthermore, in many instances, the magnetic strip of an MTC sensor may be formed (e.g., bent, arranged, or the like) in a spiral shape (e.g., a square spiral shape) about a center of the magnetic strip of the MTC sensor. Accordingly, the greater the number of turns of an external magnetic field (i.e., the turns of a magnet producing the external magnetic field) that an MTC sensor is to be able to count, the greater the number of strip turns (e.g., turns of the magnetic strip) that are to be included in the spiral magnetic strip. For MTC sensors that include a spiral magnetic strip, the magnetic strip is formed such that a distance between the center of the spiral magnetic strip and each strip turn of the magnetic strip increases (i.e., each part of the magnetic strip that includes a rotation of the magnetic strip about the center of the spiral magnetic strip) when tapping (e.g., a voltage tap) from an inside strip turn of the spiral magnetic strip to an outside strip turn of the spiral magnetic strip. Considering that half-bridges are formed from voltage taps at locations of the strip turns of the spiral magnetic strip, a distance from an inside strip turn of the spiral magnetic strip and a distance from an outside strip turn of the spiral magnetic strip may not be equivalent, resulting in different read out times for each strip turn of the magnetic strip.

According to some implementations described herein, an MTC sensor may include a magnetic strip with overlapping strip turns and corresponding crossings in the magnetic strip. To account for the crossings, in some implementations, an MTC sensor may include phase delaying bends in the magnetic strip and/or strip narrowings at crossings of the magnetic strip to ensure that the domain walls propagate across the crossings as expected and are in an appropriate location to determine a turn count associated with a magnetic field of a magnet (and/or corresponding rotatable object).

Accordingly, some implementations described herein may provide techniques to increase (over previous techniques) an accuracy of measuring a turn count. For example, as described herein, an MTC sensor may include at least one of an IMC layer, a magnetic strip with overlapping strip turns and/or crossings, phase delaying bends in the overlapping strip turns, and/or strip narrowings in the magnetic strip at the crossings. Accordingly, incorrect turn counts may be avoided, thereby reducing errors and/or misrepresentations of determining a turn count.

FIGS. 1A-1D are diagrams of an overview of example implementations described herein. In FIGS. 1A-1D, multi-turn counter (MTC) sensors or components of MTC sensors are illustrated according to example implementations described herein.

As shown in FIG. 1A, an example implementation 100A of a single turn counter illustrates principles of domain walls and/or a DWG. The single turn counter includes a magnetic strip that has a single strip turn, and thus can only count position of a magnetic field relative to a single strip turn. As shown in FIG. 1A, the magnetic strip includes a DWG and an end tip with a supply voltage (VDD) applied at a first bend, a terminal (V1) located at a second bend, and a ground (GND) located at a third bend of the magnetic strip.

As further shown in FIG. 1A, and by reference number 102 in the upper left portion of FIG. 1A, a magnetic field (Beit) is in a zero degree direction. The magnetic field in the upper left portion of FIG. 1A causes segments (a length or portion of the magnetic strip reference numeral missing between two bends in the magnetic strip) of the magnetic strip to be magnetized toward or away from bends of the magnetic strip. As such, a first domain wall, e.g., a 180 degree domain wall (DW1), is formed at a bend when adjacent segments of the bend are magnetized in opposite directions. Accordingly, as shown by reference number 102, a domain wall DW1 is formed at the V1 bend. Conversely, at the Vdd bend as well as at the ground bend, namely top and bottom bends in 102 of FIG. 1A, there are no domain walls. As further shown in FIG. 1A, and by reference number 104, a 90 degree rotation of the magnetic field Bext clockwise causes the domain wall DW1 to propagate from the V1 bend to the GND bend, thereby remagnetizing the strip portion between the V1 bend and the GND bend by 180 degree. The formation of DW1 at the GND bend is due to the segments adjacent the GND bend now being magnetized in opposite directions. At the same time a 180 degree domain wall DW2 is generated in the region between the domain wall generator (DWG) and the corresponding connected strip portion and propagates to the VDD bend.

As further shown in FIG. 1A, and by reference number 106, a further 90 degree rotation of the magnetic field clockwise (e.g., to 180 degrees) causes the domain wall DW2 to propagate to the V1 bend as after the further 90 degree rotation the segments adjacent the V1 bend are magnetized in opposite directions. Upon the further 90 degree rotation of 106, the domain wall DW1 further propagates to an end tip 107 of the structure and is annihilated.

As further shown in FIG. 1A, and by reference number 108, a further 90 degree rotation of the magnetic field clockwise relative to the situation depicted with respect to reference number 106, and corresponding to a 270 degree turn starting from the situation depicted with respect to reference number 102, causes the domain wall DW2 to propagate to the GND bend, as now the segments adjacent the GND bend are magnetized in opposite directions. At the same time a further 180 degree domain wall DW3 is generated in the region between the domain wall generator (DWG) and the corresponding connected strip portion propagating to the VDD bend, thereby remagnetizing the magnetization of the strip portion between VDD and DWG by 180 degrees. Accordingly, a sensing element of the single turn counter of FIG. 1A may determine a turn count corresponding to the domain wall being located at the GND bend with a magnetic field in a direction of 270 degrees.

As such, a location of a domain wall in the magnetic strip may be based on a magnetic field caused by a magnet. The location of the domain walls DW1, DW2, DW3 in the magnetic strip may indicate a turn count of a magnetic field the device of FIG. 1A is exposed. This is to say, in the device of FIG. 1A quarters of a full rotation of the magnetic field can be resolved. Obviously, multiple ones of such quarters can be indicated as well.

A sensing device as depicted in FIG. 1A indicates a 0 degree position for the situation 102. In section 104 a 90 degree turn is indicated by the sensing device. The situation depicted in 106 causes the sensing device to indicate a 180 degree turn compared to 102. Finally, the device indicates a 270 degree turn compared to 102 in section 108. Therefore, the sensing device of FIG. 1A may determine a full rotation in steps of 90 degrees. In order to sense N full turns with N being a positive integer, a sensing device with a quadratically-shaped spiral magnetic strip having N strip turns instead of the one strip turn shown in FIG. 1A.

Accordingly, domain walls may enable an MTC sensor to determine a turn count of a magnetic field (and thus a rotatable object that includes a magnet causing the magnetic field).

Figure 1B:
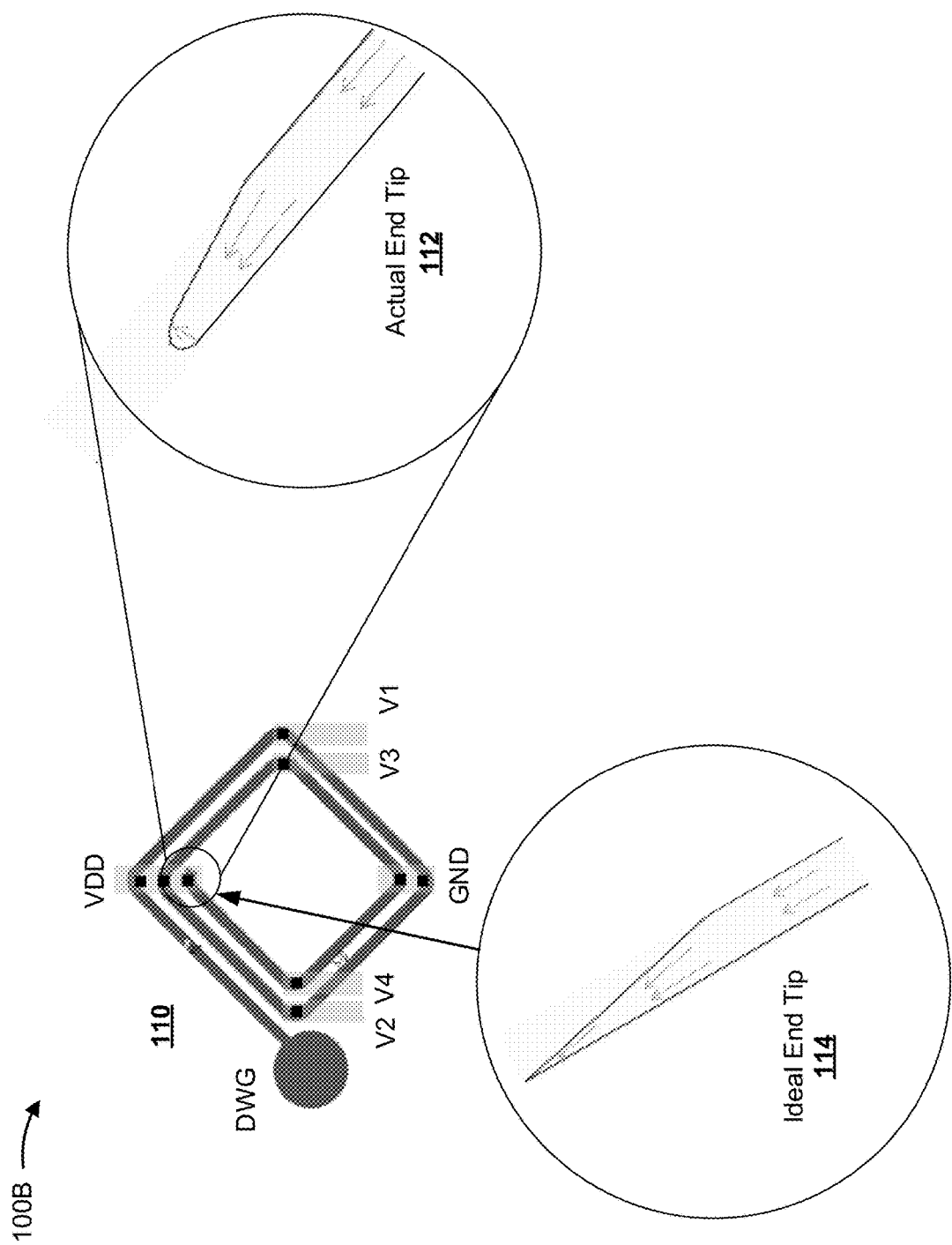

As shown in FIG. 1B, and by reference number 110, an example implementation 100B of an MTC sensor includes a quadratically-shaped spiral magnetic strip. As shown, every spiral strip turn includes four straight segments of the magnetic strip that are oriented perpendicular to one another. Accordingly, between each segment, bends in the magnetic strip may be metastable locations for a DW. This is to say that, domain walls DW may jump from one bend to a connected one, if a sufficient amount of magnetic energy is provided. A change in direction or strength of external magnetic field may provide such a sufficient amount of magnetic energy, as described below. In the example of FIG. 1B, several half-bridges at opposing bends are connected to supply voltage (VDD) and ground (GND), respectively. At the other bends, mid voltage terminals (V1-V4) of the half-bridges are tapped (e.g., to determine the location of the domain walls). In some implementations, the MTC sensor of example implementation 100B may include a metal stack exhibiting a giant magnetoresistance (GMR) effect. The basic components of the GMR stack may be a sensor layer which aligns with its magnetization according to an external in-plane magnetic field and a reference layer having a fixed magnetization in a predefined direction. For the MTC sensor of example implementation 100B, the sensor layer may exhibit a large shape anisotropy in order to avoid causing a remagnetization by an external magnetic field (e.g., $B_{ext}$ of FIG. 1A). According to some implementations, the MTC sensor of FIG. 1B may only allow a remagnetization to be initiated by movement of a domain wall.

As further shown in FIG. 1B, and by reference number 112, an actual end tip of the MTC sensor of example implementation 100B may cause issues with a domain wall in the MTC sensor. For example, a sufficiently large magnetic working range may be necessary when determining a turn count in a particular environment (e.g., an automotive environment). As such, a minimum magnetic field strength may be determined by a magnetic field needed to move a domain wall (e.g., a 180 degree DW) through the spiral magnetic strip of FIG. 1B. Further, a maximum magnetic field strength may be below a value at which the domain walls are generated spontaneously inside the spiral magnetic strip, which may be determined based on shape anisotropy of the spiral magnetic strip. One reason to lower a maximum magnetic field strength may be the imperfections of the actual end tip. As shown by reference number 114, an ideal end tip of the magnetic strip ends in a sharp point. However, an ideal end tip of a magnet strip may not be possible to create due to manufacturing tolerances. For example, due to manufacturing tolerances (e.g., in a lithography process), the actual end tip, as shown, is rounded such that a minimum width of the end tip of the magnetic strip is approximately one third of the width of the magnetic strip. Such end tips, which are not ideal, may give rise to generation of domain walls at magnetic field strengths that are lower than a maximum possible magnetic field strength defined by the shape anisotropy of the magnetic strip. According to some implementations described herein, the shape anisotropy of the magnetic strip (especially at the end tip) and an MTC sensor may be addressed using an IMC layer to reduce a probability of unexpected generation of domain walls in the magnetic strip.

Furthermore, the spiral magnetic strip of FIG. 1B, having a radius that varies as a function of an angle $\Theta$ ($r=f(\Theta)$) may lead to a decreasing length of half-bridge legs (especially for spirals with a large amount of strip turns (e.g., over 10 strip turns)) when walking from outside the spiral magnetic strip towards its center. As such, different/reduced half-bridge legs may lead to an unfavorable, reduced signal magnitude.

Additionally, or alternatively, different half-bridge resistor values across the spiral magnetic strip, namely for half bridge segments connecting supply voltage VDD and Ground GND via a selected one of terminals V1, V2, . . . , V5, V6 may lead to an increased influence of wiring and/or contact resistances on offset values for the respective half-bridge, as wiring and/or contact resistances may become dominant for reduced magnetic strip length of a selected half-bridge. This increased influence of wiring and/or contact resistances may, result in varying/increased absolute offset values and/or varying/increased temperature coefficients of the offsets. Accordingly, a spiral magnetic strip in an MTC sensor may be disadvantageous. According to some implementations described herein, a magnetic strip of an MTC sensor may be non-spiral shaped.

Figure 1C:
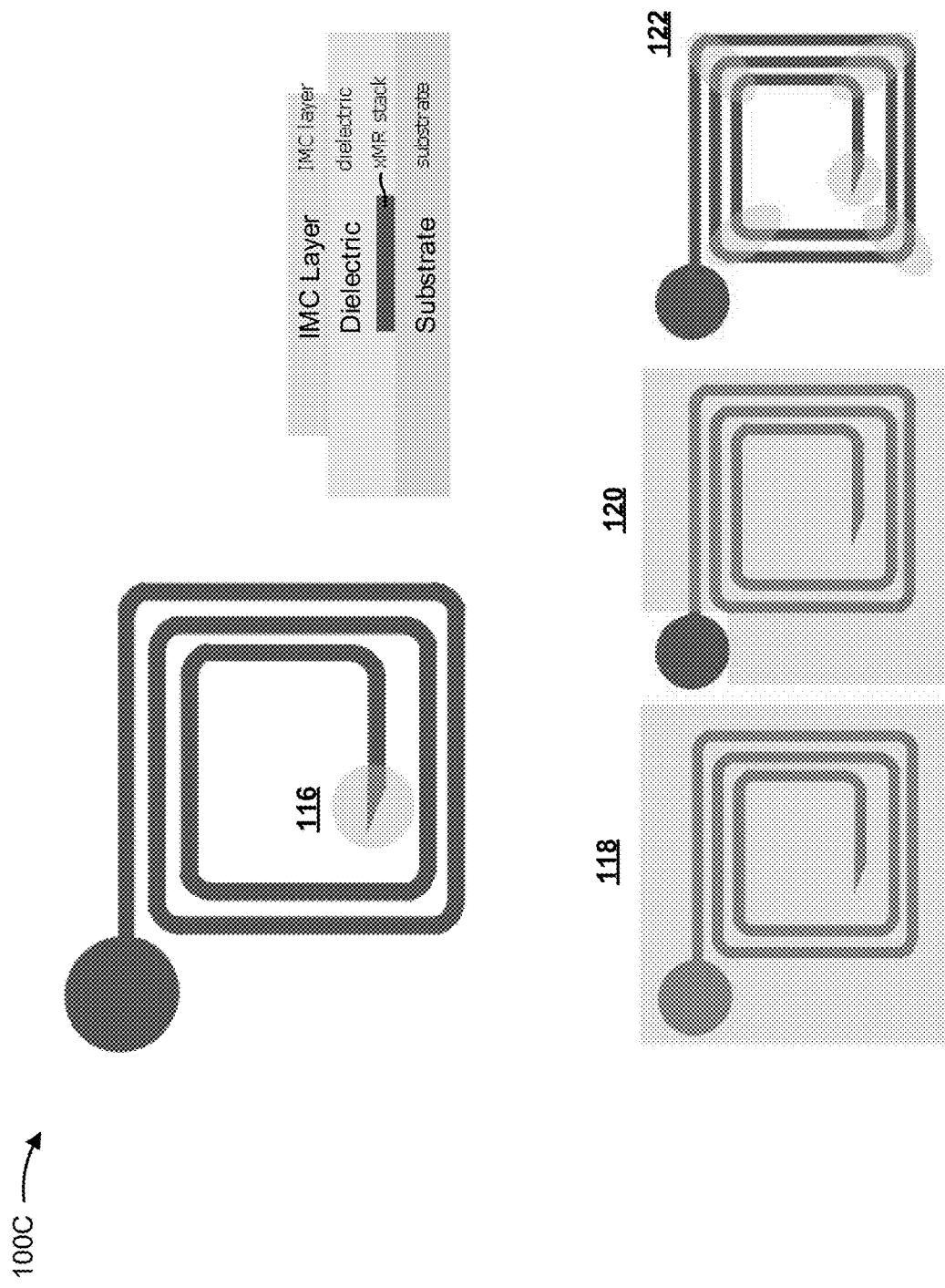

As shown in FIG. 1C, an example implementation 100C of an MTC sensor for determining a turn count is provided. As shown in FIG. 1C, an IMC layer is configured to be situated adjacent at least a part of a magnetic strip of an MTC sensor. In some implementations, the IMC layer may be configured to be situated between at least a part of the magnetic strip of the MTC sensor and a magnet causing a magnetic field sensed by the MTC sensor (e.g., a magnet on a rotatable object monitored by the MTC sensor). The example IMC layer may be a permeable film formed from at least one of a cobalt, iron, or nickel alloy (e.g., Ni(81)Fe(19) (i.e., permalloy)). As shown in example implementation 100C, an example cross section of MTC sensor at the IMC layer location shows that the IMC layer may be placed above a dielectric of the MTC sensor, the xMR stack (or the magnetic strip) may be within or connected to the dielectric, and the dielectric may be placed on a substrate. As shown, the IMC layer overlaps the xMR stack. The substrate may include metal layers for contacting and wiring the MTC sensor or may include further layers to build active or passive devices to provide monolithically integrated circuitry for signal conditioning of the MTC sensor.

As shown by reference number 116, an IMC layer may be situated over or adjacent to an end tip of the magnetic strip. Accordingly, the IMC layer may prevent unexpected domain walls form being generated at the end tip of the magnetic strip. In some implementations, as shown by reference number 118, the IMC layer may be configured to be situated over the entire magnetic strip (e.g., such that the IMC layer is configured to be situated between a magnet and the entire magnetic strip). In such a case, an increase in a minimum magnetic field strength may be achieved by a shielding factor ($f_{sh}$), as described below, and a maximum magnetic field strength may be increased by the shielding factor (which can be beneficial for robust operation). As shown by reference number 120 of FIG. 1C, the IMC layer may be configured to be situated over at least a portion of the magnetic strip but omitted over the DWG (e.g., such that the IMC layer is configured to be situated between a magnet and the magnetic strip except for the DWG). In such a case, the magnetic field needed for domain wall generation at the DWG may not be influenced or increased. As further shown in FIG. 1C, and by reference number 122, the IMC layer may be configured to be situated over bends of magnetic strip (e.g., such that the IMC layer is configured to be situated between a magnet and the bends of the magnetic strip). As such, a probability of unexpected generation of domain walls at the bends may be limited.

Figure 1D:
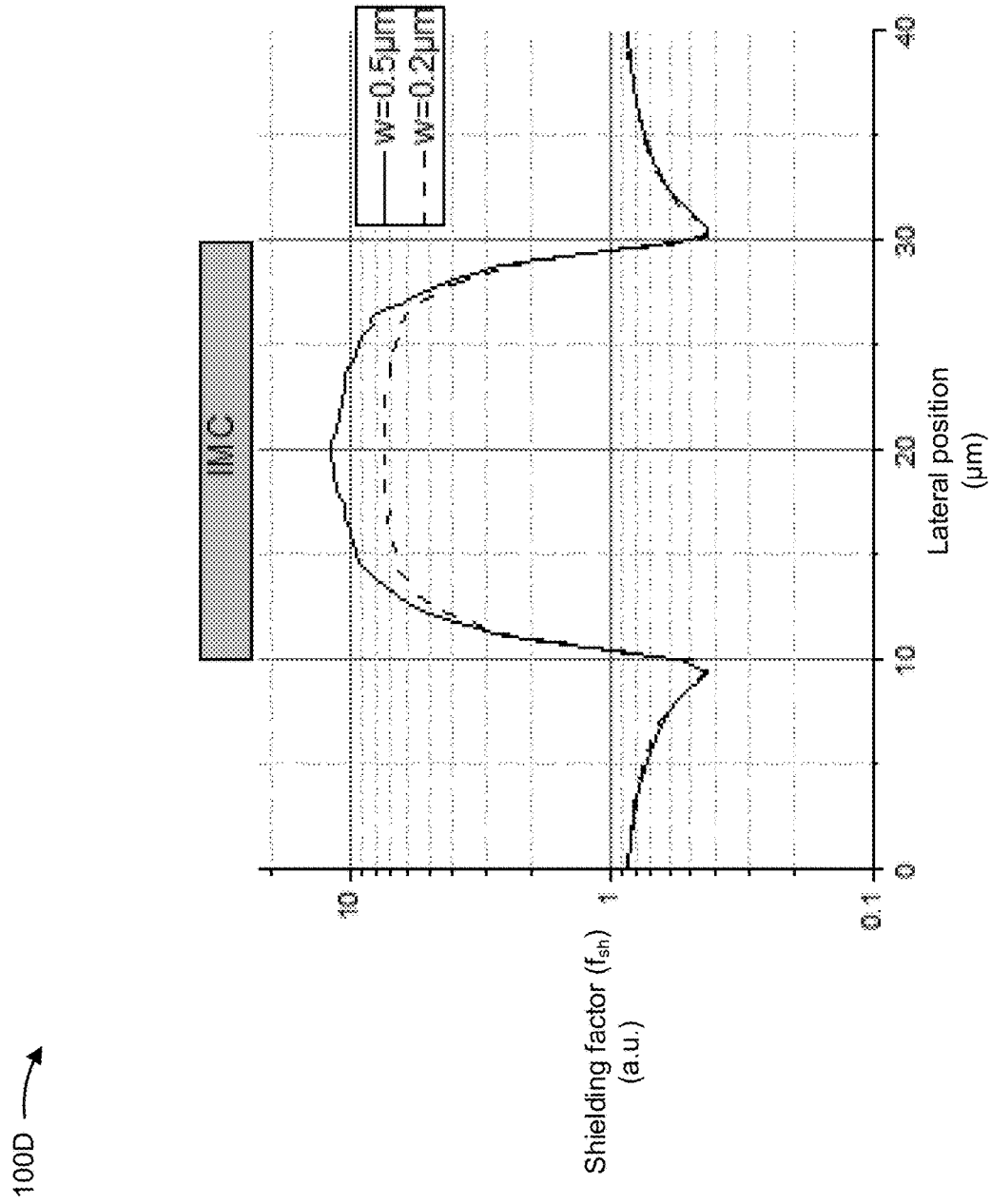

FIG. 1D is a diagram associated with an example implementation of an MTC sensor including an IMC layer and an example graph 100D of the MTC sensor including the IMC layer, as described herein. More specifically, example graph 100D of FIG. 1D illustrates example results of a shielding factor $f_{sh}$, $f_{sh}$ being defined as a magnetic field B at a lateral position of the MTC relative to the IMC with and without the IMC, namely $f_{sh}=B_{without\ IMC}/B_{with\ IMC}$.

In the illustrated example graph 100D, a 500 nm (w=0.5 µm) thick NiFe may be assumed with a permeability of 1000 (µr=1000) and a distance of 0.5 µm to the sensing plane of the MTC sensor (solid line in FIG. 1D). A maximum achievable shielding factor is 11.8 taken at the center beneath the IMC, namely at 20 µm lateral position. This maximum shielding factor corresponds to an effective magnetic field of $1/11.8*B_{ext}$, i.e. only 8.5% of external in-plane field may be effective at a position of the end tip. Furthermore, as shown in example graph 100D, after reduction of the film thickness to 200 nm (w=0.2 µm, indicated by the dashed line), a maximum achievable shielding factor of about 7.5 taken at the center beneath the IMC, corresponds to an effective magnetic field of only 13% of the external magnetic field. Accordingly, example graph 100D of FIG. 1D may indicate that a homogeneous magnetic field value (i.e., without the effects of shape anisotropy of the magnetic strip) may be found approximately 5 µm from one of the edges of the IMC layer at lateral positions of 10 and 30 µm, respectively.

As shown by example graph 100D, the IMC locally reduces the magnetic field strength effective at the MTC structure. It is to be understood that a shape anisotropy of the magnetic strips or tip gives a maximum allowed magnetic field for operating the MTC. In some implementations, the IMC locally reducing the magnetic field may permit operation of the MTC at higher magnetic fields than without the IMC.

In case only critical portions of the MTC, namely the end tip, the bend, or all bends, are covered with the IMC, the maximum allowed magnetic field can be enlarged, approximating from lower field strengths magnitudes the maximum allowed magnetic field as defined by the shape anisotropy of the MTC strips.

Covering the entire MTC structure with the IMC, may lead to a shift of the maximum allowed magnetic field even beyond the limit set by the shape anisotropy of the magnetic strips or tip of the MTC structure.

Accordingly, in some implementations, an MTC sensor may include an IMC layer to account for shape anisotropy of a magnetic strip (e.g., imperfections in an end tip of the magnetic strip).

As indicated above, FIGS. 1A-1D are provided merely as examples. Other examples are possible and may differ from what was described with regard to FIGS. 1A-1D.

Figure 2:
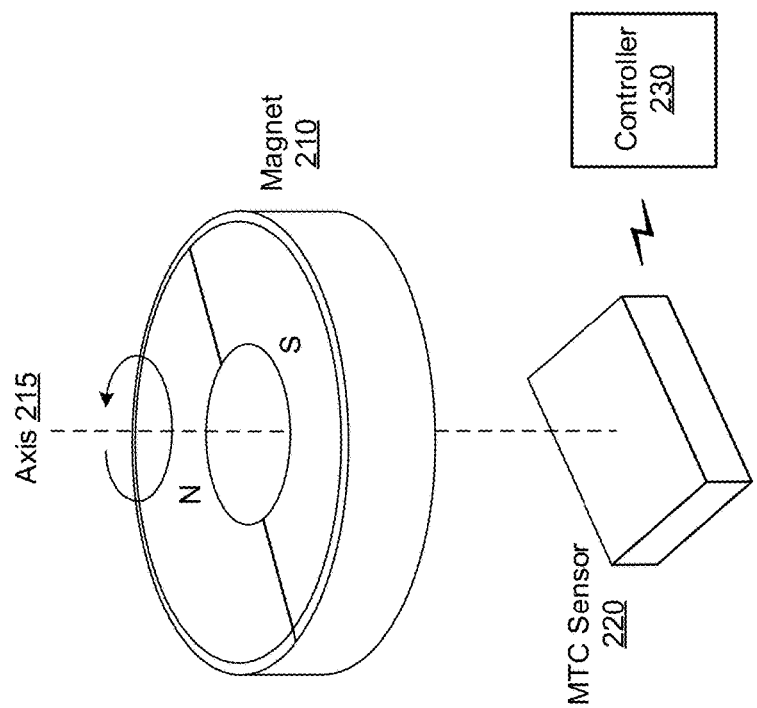
FIG. 2 is a diagram of an example environment in which systems and/or methods, described herein, may be implemented.

FIG. 2 is a diagram of an example environment 200 in which apparatuses described herein may be implemented. As shown in FIG. 2, environment 200 may include a magnet 210 that may rotate about an axis 215, an MTC sensor 220, and a controller 230.

Magnet 210 includes one or more magnets positioned to rotate about axis 215 (e.g., an imaginary line). In some implementations, magnet 210 may be connected (e.g., mechanically) to a rotatable object (not shown) such that a rotation angle of magnet 210 corresponds to a rotation angle of the rotatable object (e.g., when there exists a non-slip relation between an end face of the rotatable object and magnet 210).

In the example environment 200 shown in FIG. 2, magnet 210 comprises a first half forming a north pole (N) and a second half forming a south pole (S), so that magnet 210 comprises one pole pair. In some implementations, magnet 210 may, without limitation, comprise more than one pole pair. In some implementations, magnet 210 may include a disk magnet that is positioned concentrically about axis 215 that passes through the center of magnet 210, as shown in FIG. 2. While magnet 210 is shown as circular in FIG. 2, magnet 210 may be another shape, such as a square, a rectangular, an ellipse, or the like. For example, magnet 210 may be of an elliptical shape in an instance where an angle between a plane corresponding to a surface of magnet 210 and axis 215 deviates from a substantially perpendicular relation. The plane may include a plane symmetrically cutting through magnet 210 and including a magnet center of magnet 210. In most practical cases, the plane may be substantially perpendicular to axis 215. As another example, magnet 210 may include a ring magnet that is positioned to rotate about axis 215 (along with the rotatable object). A ring magnet may be of interest for an arrangement of magnet 210 at an end of the rotatable object.

In some implementations, magnet 210 may include two alternating poles on at least two portions of magnet 210. For example, magnet 210 may include a diametrically magnetized magnet with a north pole on a first half of magnet 210 and a south pole on a second half of magnet 210, as shown in FIG. 2. As another example, magnet 210 may include an axially magnetized magnet with a first north pole and a first south pole stacked on a first half of magnet 210, and a second south pole and a second north pole stacked on a second half of magnet 210 (not shown).

Additionally, or alternatively, magnet 210 may include a dipole magnet (e.g., a dipole bar magnet, a circular dipole magnet, an elliptical dipole magnet, etc.), a permanent magnet, an electromagnet, a magnetic tape, or the like. Magnet 210 may be comprised of a ferromagnetic material (e.g., Hard Ferrite), and may produce a magnetic field. Magnet 210 may further comprise a rare earth magnet which may be of advantage due to an intrinsically high magnetic field strength of rare earth magnets. As described above, in some implementations, magnet 210 may be attached to or integrated into a rotatable object for which a rotation angle may be determined (e.g., by MTC sensor 220, by controller 230) based on a rotation angle of magnet 210.

MTC sensor 220 includes one or more apparatuses for sensing components of a magnetic field for use in determining a turn count (e.g., of magnet 210, of a rotatable object to which magnet 210 is attached or formed as a part of, etc.). For example, MTC sensor 220 may include one or more circuits (e.g., one or more integrated circuits). In some implementations, MTC sensor 220 may be placed at a position relative to magnet 210 such that MTC sensor 220 may detect components of the magnetic field produced by magnet 210. In some implementations, MTC sensor 220 may include an integrated circuit that includes an integrated controller 230 (e.g., such that an output of MTC sensor 220 may include information that describes a rotation angle of magnet 210 and/or the rotatable object).

In some implementations, MTC sensor 220 may include a group of sensing elements configured to sense components of the magnetic field, produced by magnet 210, that are present at MTC sensor 220. For example, MTC sensor 220 may include a first sensing element (e.g., arranged substantially on a first plane proximal to magnet 210) associated with determining the rotation angle and a second sensing element (e.g., arranged substantially on a second plane distal to magnet 210) associated with determining the rotation angle. In some implementations, MTC sensor 220 is capable of operating in a non-saturated mode (i.e., output signals associated with sensing elements of MTC sensor 220 are dependent on a strength of the magnetic field). Additional details regarding MTC sensor 220 are described below with regard to FIG. 3.

Controller 230 includes one or more circuits associated with determining a rotation angle of magnet 210, and providing information associated with the turn count of magnet 210 and hence the rotation angle of the rotatable object to which magnet 210 is connected. For example, controller 230 may include one or more circuits (e.g., an integrated circuit, a control circuit, a feedback circuit, etc.). Controller 230 may receive input signals from one or more sensors, such as one or more MTC sensors 220, may process the input signals (e.g., using an analog signal processor, a digital signal processor, etc.) to generate an output signal, and may provide the output signal to one or more other devices or systems. For example, controller 230 may receive one or more input signals from MTC sensor 220, and may use the one or more input signals to generate an output signal comprising the angular position of magnet 210 and/or the rotatable object to which magnet 210 is attached (or formed as part of).

The number and arrangement of apparatuses shown in FIG. 2 are provided as an example. In practice, there may be additional apparatuses, fewer apparatuses, different apparatuses, or differently arranged apparatuses than those shown in FIG. 2. Furthermore, two or more apparatuses shown in FIG. 2 may be implemented within a single apparatus, or a single apparatus shown in FIG. 2 may be implemented as multiple, distributed apparatuses. Additionally, or alternatively, a set of apparatuses (e.g., one or more apparatuses) of environment 200 may perform one or more functions described as being performed by another set of apparatuses of environment 200.

Figure 3:
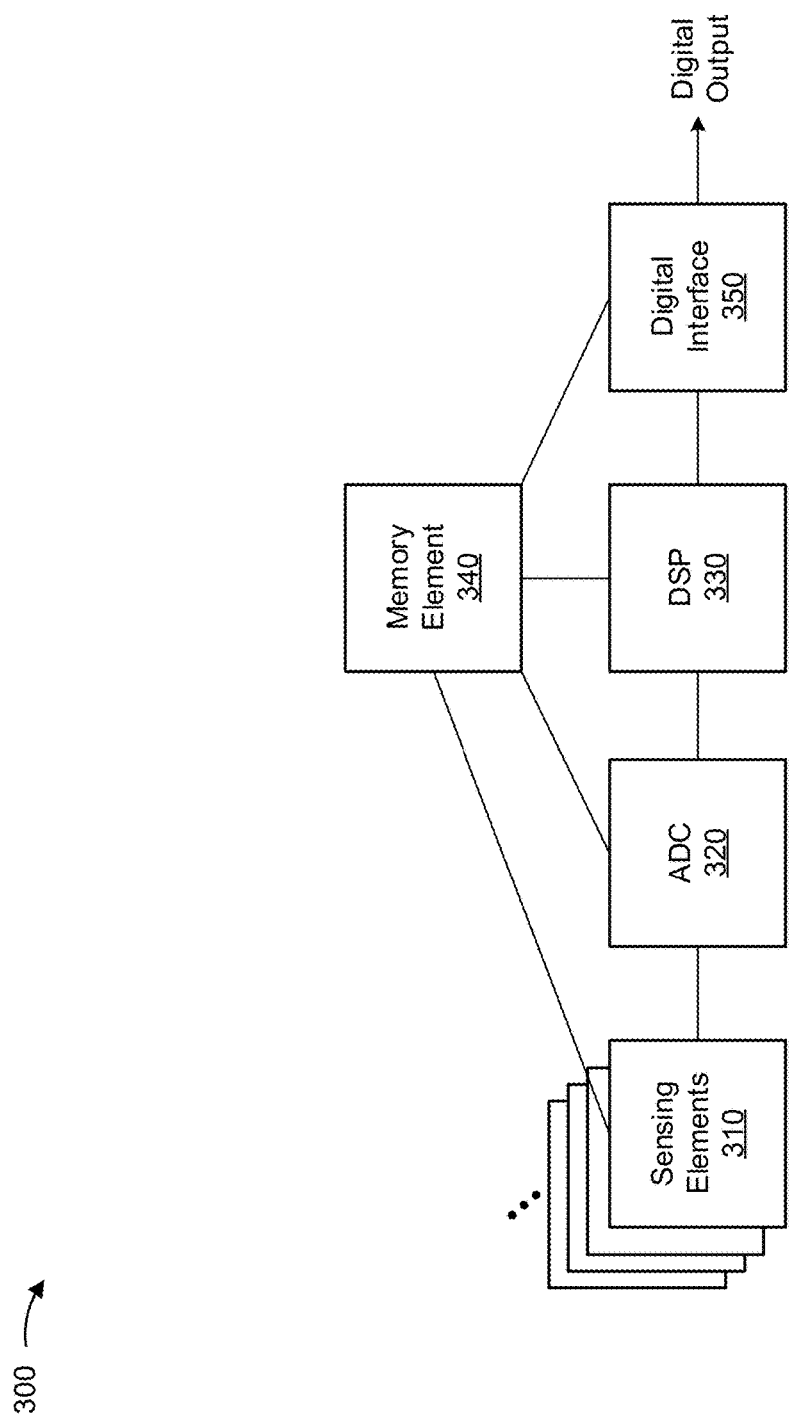
FIG. 3 is a diagram of example elements of a multi-turn counter sensor included in the example environment of FIG. 2.

FIG. 3 is a diagram of example elements 300 of MTC sensor 220 included in example environment 200 of FIG. 2. As shown, MTC sensor 220 may include a group of sensing elements 310, an analog-to-digital convertor (ADC) 320, a digital signal processor (DSP) 330, a memory element 340, and a digital interface 350.

Sensing element 310 includes an element for sensing a component of a magnetic field present at MTC sensor 220 (e.g., the magnetic field generated by magnet 210). For example, sensing element 310 may include an MR-based sensing element, elements of which are comprised of a magnetoresistive material (e.g., nickel-iron (NiFe)), where the electrical resistance of the magnetoresistive material may depend on a strength and/or a direction of the magnetic field present at the magnetoresistive material. Here, sensing element 310 may operate based on an anisotropic magnetoresistance (AMR) effect, a giant magnetoresistance (GMR) effect, a tunnel magnetoresistance (TMR) effect, or the like. As another example, sensing element 310 may include a Hall-based sensing element that operates based on a Hall-effect. As an additional example, sensing element 310 may include a variable reluctance (VR) based sensing element that operates based on induction. In some implementations, sensing element 310 operates in a non-saturated mode (i.e., such that an amplitude of an output signal provided by sensing element 310 is dependent on a strength of the magnetic field at sensing element 310). Additional details regarding sensing elements 310 are described below with regard to FIG. 4.

ADC 320 includes an analog-to-digital converter that converts an analog signal from the one or more sensing elements 310 to a digital signal. For example, ADC 320 may convert analog signals, received from the one or more sensing elements 310, into digital signals to be processed by DSP 330. ADC 320 may provide the digital signals to DSP 330. In some implementations, MTC sensor 220 may include one or more ADCs 320.

DSP 330 includes a digital signal processing device or a collection of digital signal processing devices. In some implementations, DSP 330 may receive digital signals from ADC 320 and may process the digital signals to form output signals (e.g., destined for controller 230 as shown in FIG. 2), such as output signals associated with determining the rotation angle of magnet 210 rotating with a rotatable object.

Memory element 340 includes a read only memory (ROM) (e.g., an EEPROM), a random access memory (RAM), and/or another type of dynamic or static storage device (e.g., a flash memory, a magnetic memory, an optical memory, etc.) that stores information and/or instructions for use by MTC sensor 220. In some implementations, memory element 340 may store information associated with processing performed by DSP 330. Additionally, or alternatively, memory element 340 may store configurational values or parameters for sensing elements 310 and/or information for one or more other elements of MTC sensor 220, such as ADC 320 or digital interface 350.

Digital interface 350 includes an interface via which MTC sensor 220 may receive and/or provide information from and/or to another device, such as controller 230 (see FIG. 2). For example, digital interface 350 may provide the output signal, determined by DSP 330, to controller 230 and may further receive information from the controller 230.

The number and arrangement of elements shown in FIG. 3 are provided as an example. In practice, MTC sensor 220 may include additional elements, fewer elements, different elements, or differently arranged elements than those shown in FIG. 3. Additionally, or alternatively, a set of elements (e.g., one or more elements) of MTC sensor 220 may perform one or more functions described as being performed by another set of elements of MTC sensor 220.

Figure 4:
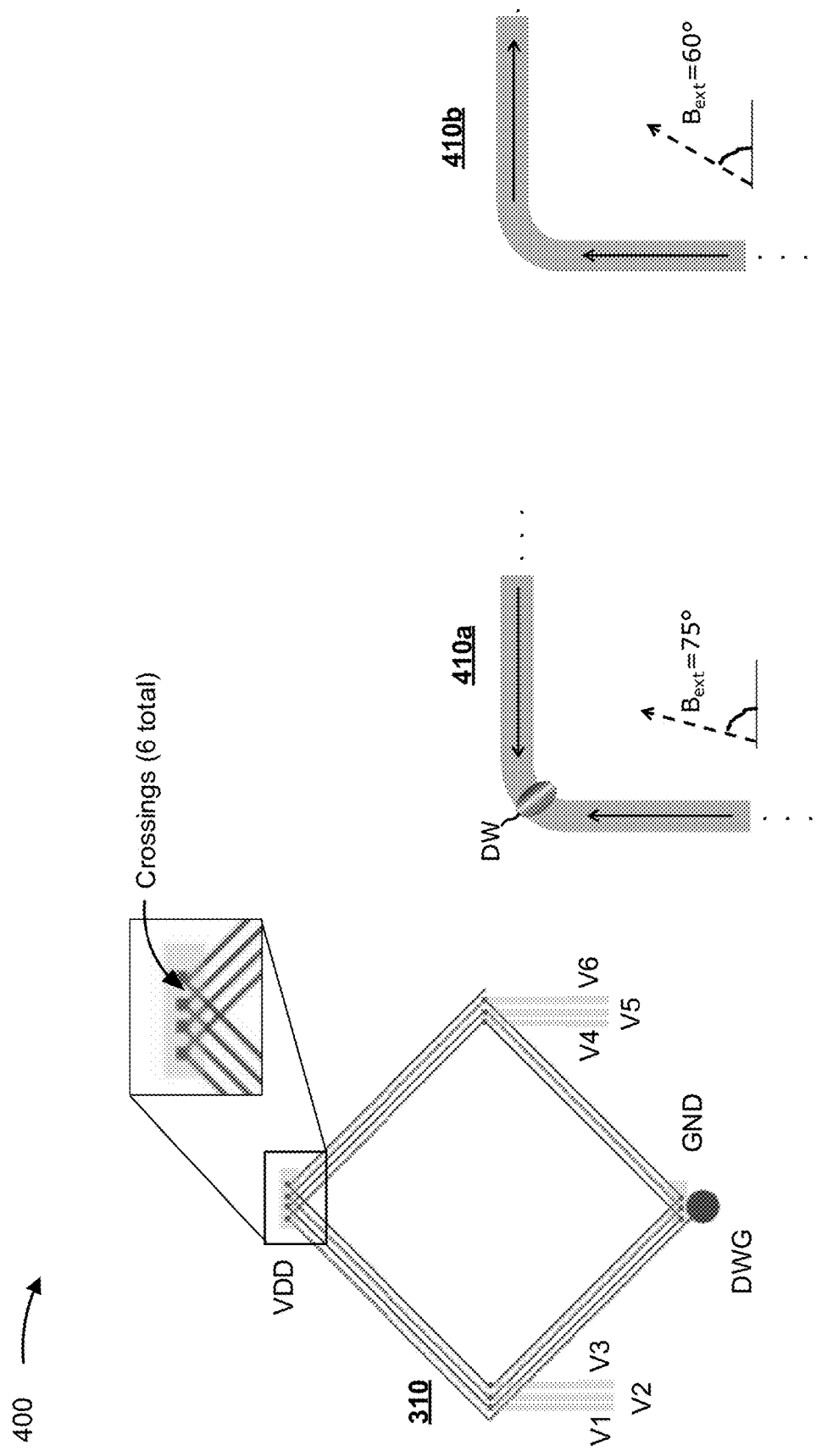
FIG. 4 is a diagram of an example implementation of a multi-turn counter sensor described herein.

FIG. 4 is a diagram of an example implementation 400 of a sensing element 310 that may be included in MTC sensor 220 of FIG. 2. As mentioned above, a spiral-shaped magnetic strip of an MTC sensor may be unfavorable or disadvantageous due to differences in lengths of half-bridge legs among the strip turns of the spiral.

As shown in FIG. 4, in some implementations, sensing element 310 may include a magnetic strip that includes a plurality of overlapping strip turns that cause a plurality of corresponding crossings in the magnetic strip. The example sensing element 310 of FIG. 4 may be a three strip turn open loop magnetic strip (and, thus, can count up to three turns). As shown in FIG. 4, the strip turns of the sensing element 310 may be a relatively similar size. This is to say half bridges defined by magnetic strip segments connecting VDD and ground GND via a selected one of V1, V2, . . . , V5, V6 are of similar size. In some implementations, an offset and/or balancing of such half bridges may be simplified due to this similarity in size. It is to be understood that this similarity in size for the sensing element is independent of the number of strip turns of the magnetic strip of the sensing element 310, which can be a further advantage over the sensing element comprising the spiral shaped magnetic strip as discussed with regards to FIG. 1B.

As shown by the sensing element 310 of FIG. 4, when the magnetic strip includes overlapping strip turns, crossings may be formed, as indicated for the magnified portion of sensing element 310 in FIG. 4. In some implementations, the number of crossings in a magnetic strip may be based on a number of full strip turns of the magnetic strip. For example, the number of crossings may be a multiple of the number of full strip turns and/or equal to the number of full strip turns of the magnetic strip. In other words, the crossings are locations of the magnetic strip at which the magnetic strip intersects itself. According to some implementations described herein, a domain wall may propagate across the crossings if the magnetic field is in a direction that the domain wall is supposed to propagate along.

As further shown in FIG. 4, and by reference number 410a, 410b, for a standard case of a propagating domain wall along a 90 degree bend, a start of the domain wall propagation may begin at an angle between a direction of the magnetic field (Beit) and the magnetic strip along an axis of 60 degrees.

In 410a magnetization of portions of the magnetic strip is indicated by solid arrows along respective portions of the magnetic strip. A domain wall DW is located in the corner of the 90 degree corner of the magnetic strip for an orientation of the external magnetic field B_ext of 75 degrees as indicated by a broken arrow.

The situation of 410b differs to the one depicted in 410a by the external magnetic field B_ext having rotated further clockwise to an angle of 60 degrees. The further rotation of the external magnetic field to 60 degrees caused the domain wall DW to propagate further from the position depicted in 410a.

In the event that there may be only one possibility for a domain wall to travel (e.g., in spiral magnetic strips of MTC sensors), this may not be a concern. However, a crossing in the magnetic strip of FIG. 4 may offer a possibility of a domain wall to perform an unintended turn at the crossing (rather than continue to go straight through as designed). As such, an angle of the magnetic field where the domain wall propagation begins, according to an orientation of the magnetic strip after the 90 degree bend, is a factor in ensuring a domain wall correctly propagates across the crossing as intended.

As further shown in 410a, 410b of FIG. 4, for a standard 90 degree bend, the aforementioned propagation starting angle of 60 degrees may result in a significant field component perpendicular to an intended propagation direction of a domain wall, giving rise to a reasonable probability for the domain wall, depending on the strength of the perpendicular magnetic field component, to initiate a turn at a crossing in a wrong direction, and disabling the functionality of sensing element 310. Accordingly, in some implementations, phase delaying bends may be implemented at bends of a magnetic strip as described herein.

As indicated above, FIG. 4 is provided merely as an example. Other examples are possible and may differ from what was described with regard to FIG. 4.

Figure 5:
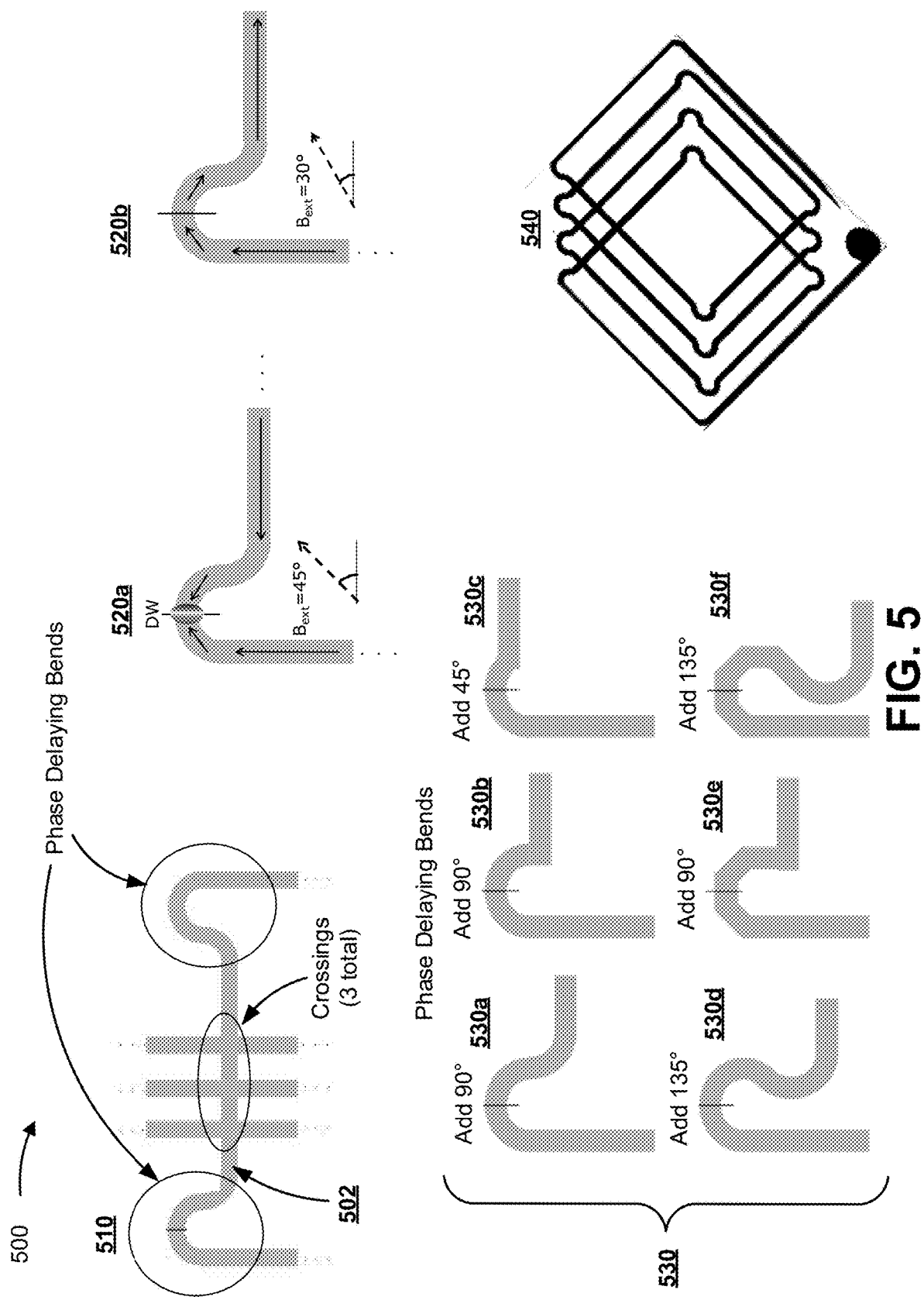
FIG. 5 includes diagrams of example implementations of phase delaying bends that may be implemented in a multi-turn counter sensor described herein.

FIG. 5 includes diagrams of example implementations 500 of phase delaying bends that may be implemented in MTC sensor 220 and/or a sensing element 310 of MTC sensor 220. As shown in FIG. 5, and by reference number 510, to delay a start of propagating a domain wall upon a rotation of a magnetic field (e.g., corresponding to a rotation of magnet 210—not shown), a phase delaying bend may be used.

Consider a horizontal magnetic strip portion 502 as shown in 510 of Fig. For this horizontal portion a propagation direction of a domain wall is along the strip. The phase delaying bend in 510 includes a delay structure configured to delay a propagation of the domain wall with regards to an orientation of the magnetic field of a magnet providing an external magnetic field $B_{ext}$.

As shown by reference number 520a, enlarged portions of a left phase delaying bend of 510 are reproduced in FIG. 5. Magnetization of the magnetic strip is indicated for individual portions by a solid arrow for each respective portion. As can be taken from 520a, a domain wall DW is located in the phase delaying bend and stays there up to a direction of the external magnetic field $B_{ext}$ of 45 degrees as indicated by the broken arrow in 520a.

The situation shown by reference number 520b differs to the one depicted in 520a by the external magnetic field $B_{ext}$ having rotated further clockwise to an angle of 30 degrees. The further rotation of the external magnetic field to 30 degrees caused the domain wall DW to propagate further from the position depicted in 520a. In other words the phase delaying bend of 520a, 520b causes the domain wall not to start propagating at 45 degrees of the external magnetic field, as would be the case for a 90 degree bend of the magnetic strip without the phase delaying bend as is discussed in 410a, 410b of FIG. 4.

For example, as shown by reference numbers 520a and 520b of FIG. 5, besides a standard 90 degree turn as discussed with regards to 410 of FIG. 4, an additional turn of approximately 90 degrees may form a delay structure configured to delay the start of propagation of a domain wall with the magnetic field ($B_{ext}$) at a direction of 30 degrees instead of 60 degrees for the case of a no phase delaying bend as shown in FIG. 4 with respect to reference number 410. Accordingly, domain wall propagation may not begin until alignment with the magnetic field (e.g., at 30 degrees). Consequently, a field component of the external field perpendicular to the propagation direction may be reduced. Such reduction may be of interest with regards to crossings of portions of the magnetic strip as shown in 510 of FIG. 5 (please indicate all three crossings with an arrow). At each such crossing there is a probability for the domain wall to depart from straight travel along a given portion of the magnetic strip, namely the intended propagation direction. The reduction of field components perpendicular to the given portion of the magnetic strip may reduce the probability of the domain wall to turn at a crossing in an unintended direction. The start angle of domain wall propagation may depend on an absolute strength of the rotating field and may therefore vary for different B-field strengths.

As further shown in FIG. 5, and by reference number 530, phase delaying bends may include a variety of shapes and/or delay structures. For example, as shown, the phase delaying bends may include roundings (e.g., partial loop shapes), straight, polygonal portions, and/or a combination of roundings and straight, polygonal portions. As such, after a standard 90 degree turn, various types of delay structures may be added (e.g., within bends) in a magnetic strip to create a phase delaying bend. According to some implementations, and as shown, the delay structures may be greater than 30 degrees and can be up to approximately 150 degrees.

For example, as shown by reference numbers 530a and 530b of FIG. 5, a delay structure of a phase delaying bend may include a semi-circular delay structure to create a phase delaying bend that may require an additional 90 degree turn of a magnetic field before a domain wall propagates away from the phase delaying bend. As shown, a difference between the delay structure of 530a and the delay structure of 530b, is a rounded edge at an end of the delay structure of 530a and sharp edge at the end of the delay structure in 530b. As another example, as shown by reference number 530c, a delay structure of a phase delaying bend may include a partial semi-circular delay structure to create a phase delaying bend that may require less than an additional 90 degree turn (e.g., shown as an additional 45 degree turn) of a magnetic field before a domain wall propagates away from the phase delaying bend. Furthermore, as another example, as shown by reference number 530d, a delay structure of a phase delaying bend may include a semi-circular delay structure with an S-bend to create a phase delaying bend that may require an additional 135 degree turn of a magnetic field before a domain wall propagates away from the phase delaying bend.

As another example, as shown by reference numbers 530e and 530f of FIG. 5, a delay structure of a phase delaying bend may include sharp angled turns. As shown, four 45 degree turns of a delay structure (e.g. to create a 180 degree delay structure similar to the semi-circular delay structures of 510a and 510b) of a phase delaying bend may require an additional 90 degree turn of a magnetic field before a domain wall propagates away from the phase delaying bend. In some implementations, delay structures may include a combination of turns and edges. For example, as shown by reference number 530, a combination of sharp edge turns (shown as four 45 degree turns) and an S-bend can be combined within a delay structure to create a phase delaying bend that may require an additional 135 degree turn of a magnetic field before a domain wall propagates away from the phase delay bend (e.g., similar to the delay structure of 530d).

In some implementations, for an additional 135 degree turn after a standard 90 degree bend, a start of a domain wall propagation along a subsequent segment of the magnetic strip may begin at an angle of the magnetic field of zero degrees with respect to the magnetic strip alignment (i.e., there may no longer be a field component perpendicular to the domain wall propagation direction). Accordingly, an amount of a phase delay can be adjusted according to a design of a magnetic strip (e.g., a sensing element 310) of MTC sensor 220. Therefore, according to some implementations described herein, an MTC sensor 220 with a non-spiral shaped magnetic strip may be provided to ensure stable, reliable functionality.

As further shown by FIG. 5, and by reference number 540, phase delaying bends may be included within a non-spiral magnetic strip of an MTC sensor (e.g., MTC sensor 220). As shown for reference number 540, at each bend of the magnetic strip (other than the first and last bend), a phase delaying bend is included within the overlapping strip turns of the magnetic strip. Accordingly, the phase delaying bends of the magnetic strip, of the MTC sensor at reference number 540, may cause a domain wall to propagate across the crossings without turning at the crossings due to overlapping strip turns of the magnetic strip.

According to some implementations, MTC sensor 220 provides phase delaying bend functionality for both clockwise and counter-clockwise turns of a rotatable object, such that both bends of a segment of the magnetic strip contain crossings with phase delaying bends.

As indicated above, FIG. 5 is provided merely as an example. Other examples are possible and may differ from what was described with regard to FIG. 5.

Figure 6:
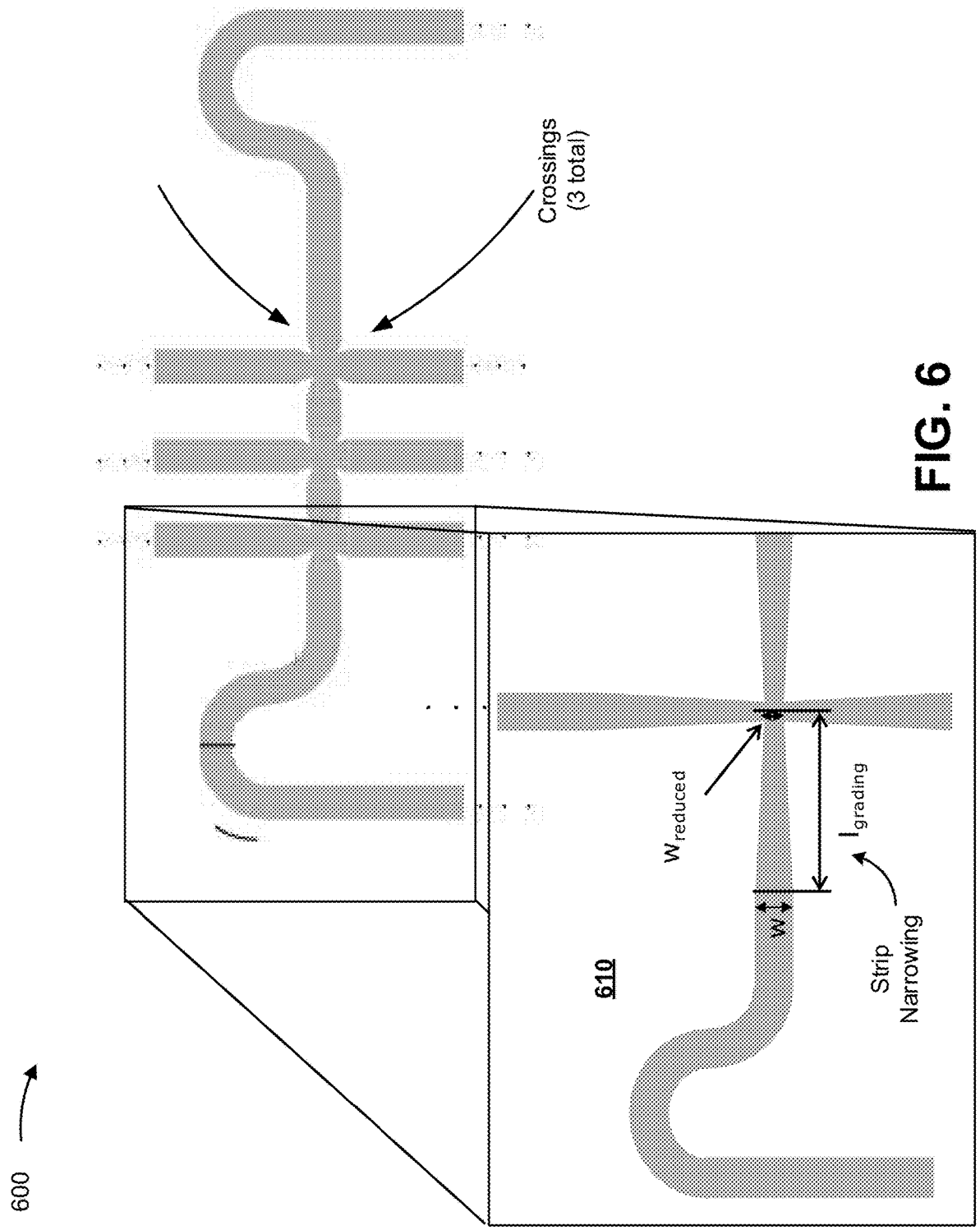
FIG. 6 is a diagram of an example implementation of strip narrowing that may be implemented in a multi-turn counter sensor described herein.

FIG. 6 is a diagram of an example implementation 600 of strip narrowing, as shown by reference number 610, that may be implemented in a multi-turn counter sensor described herein.

The example strip narrowing of FIG. 6 may be implemented in MTC sensor 220 according to some implementations described herein. In some instances, because a maximum lateral extension of a crossing, for example walking diagonally over the crossing, may be larger than a width of the magnetic strip which reduces the shape anisotropy along such path. Therefore, the crossing, itself, may cause a generation of unintended domain walls at relatively low magnetic fields. The strip narrowing helps mitigate such unintended domain wall creation at crossings.

In some implementations, a local shielding of the external magnetic field at the crossing using for example an IMC layer as discussed with regards to FIG. 1C may allow an increase of a maximum magnetic field strength. Additionally, or alternatively, a shape anisotropy may be increased at a crossing when reducing a width of the magnetic strip at the crossing. As shown by example implementations 600 of FIG. 6, the magnetic strip width (w) may be gradually decreased over a grading length ($l_{grading}$) to a reduced width ($w_{reduced}$) as the magnetic strip approaches a crossing. Further, the magnetic strip goes through the crossing at the reduced width ($w_{reduced}$), and then gradually increases (e.g. over a same grading length ($l_{grading}$) or different grading length) to the original magnetic strip width (w). As a more specific example, a width of the magnetic strip at the crossing may be between 50% and 90% of the original width of the magnetic strip. In some implementations, smooth variations of the width of the magnetic strip are of interest. A grading length indicates over what strip length a reduction in strip width extends. Such grading length may be, depending on certain circumstances, at least twice the width of the magnetic strip. It is to be noted, that the FIG. 6 is not drawn to scale.

As such, according to some implementations described herein, including strip narrowing at the crossings of a magnetic strip of MTC sensor 220 may cause generation of unintended domain walls at the crossings to be shifted toward higher magnetic field values and allow the magnetic field range to be extended.

As indicated above, FIG. 6 is provided merely as an example. Other examples are possible and may differ from what was described with regard to FIG. 6.

Figures 7A, 7B, 7C:
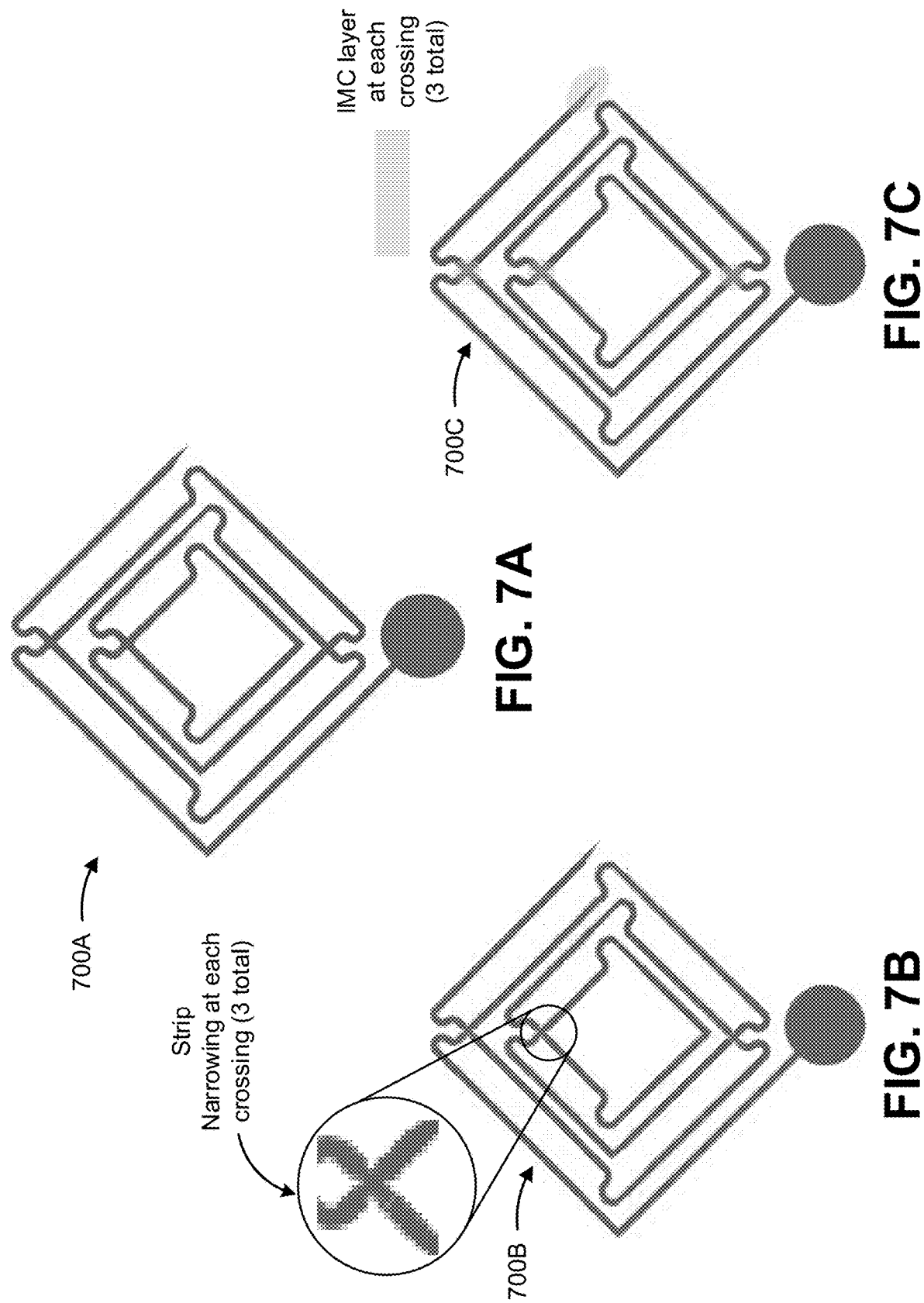
FIGS. 7A-7C are diagrams of example implementations of a multi-turn counter sensor described herein.

FIGS. 7A-7C are diagrams of example implementations 700A-700C, respectively, of a multi-turn counter sensor described herein. FIGS. 7A-7C include another non-spiral, open loop magnetic strip that may be utilized (e.g., as sensing element 310 of FIG. 3) by MTC sensor 220 to determine a turn count of magnet 210 in FIG. 2. The magnetic strips of FIGS. 7A-7C include phase delaying bends, as described herein.

As shown in FIG. 7A, the magnetic strip of example implementation 700A may include no more than one crossing in each segment. In the magnetic strip of example implementation 700A, in a non-spiral manner, the magnetic strip turns inward toward a center of the MTC sensor for two turns and then turns outward for two turns until the end tip is reached. The sense of rotation when continuously following the magnetic strip from one end to the other does not change. As such, each turn of the magnetic strip may include two phase delaying bends between a first crossing and a second crossing that is consecutive or adjacent the first crossing.

In FIG. 7B, the magnetic strip of example implementation 700B is similar to that of example implementation 700A, but the magnetic strip of example implementation 700B includes strip narrowings at each crossing of the magnetic strip, as shown enlarged in the circle and discussed with regards to FIG. 6. In FIG. 7C, the magnetic strip of example implementation 700C is similar to that of example implementation 700A, but the magnetic strip of example implementation 700C includes IMC layers situated over an end tip of the magnetic strip and over each crossing of the magnetic strip (e.g., such that the IMC layer is configured to be situated between a magnet and the end tip and crossings of the magnetic strip of example implementation 700C, respectively).

As indicated above, FIGS. 7A-7C are provided merely as examples. Other examples are possible and may differ from what was described with regard to FIGS. 7A-7C.

Some implementations described herein provide an MTC sensor that is capable of accounting for shape anisotropy and/or inhomogeneity in a magnetic strip of the MTC sensor. The MTC sensor may include one or more of an IMC layer, a magnetic strip with a non-spiral, open loop structure, a magnetic strip with phase delaying bends, and/or a magnetic strip with strip narrowings at crossings. Such implementations within the MTC sensor may ensure that domain walls are properly propagated throughout the magnetic strip corresponding to a change in magnetic field. Furthermore, such implementations may ensure that the domain walls are not unnecessarily generated in the magnetic strip or lost from the magnetic strip. As such, an MTC sensor may be configured to ensure reliable functionality of the MTC sensor to accurately determine a turn count for a rotatable object.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the terms apparatus and element are intended to be broadly construed as hardware, firmware, and/or a combination of hardware and software.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A multi-turn counter (MTC) sensor comprising:
a magnetic strip comprising:
  a domain wall generator located at a first end of the magnetic strip,
    the domain wall generator to generate at least one domain wall in the magnetic strip,
      wherein the at least one domain wall is configured to propagate based on a magnetic field caused by a magnet, and
      wherein a location of the at least one domain wall indicates a turn count of the magnetic field of the magnet,
        the turn count to indicate one or more predefined fractions of a full rotation of the magnetic field;
  an end tip located at a second end of the magnetic strip,
    wherein the second end of the magnetic strip is opposite the first end; and
  a plurality of overlapping strip turns that cause a plurality of crossings in the magnetic strip,
    wherein a width of the magnetic strip gradually decreases over a grading length of the magnetic strip as the magnetic strip approaches each crossing of the plurality of crossings, and
    wherein the width of the magnetic strip gradually increases over the grading length of the magnetic strip after the magnetic strip goes through each crossing of the plurality of crossings.

2. The MTC sensor of claim 1, wherein the turn count is further configured to indicate one or more full rotations of the magnetic field in terms of a further predefined multiplicity of the predefined fractions.

3. The MTC sensor of claim 1, where the magnetic strip further comprises:
a plurality of phase delaying bends to cause a delay of propagation of the at least one domain wall with regards to an orientation of the magnetic field based on a rotation of the magnetic field.

4. The MTC sensor of claim 1, wherein, there is no bend between a first crossing and a second crossing of one of the overlapping turns.

5. The MTC sensor of claim 1, wherein the magnetic strip includes a plurality of segments between bends,
wherein each segment of the plurality of segments comprises a portion of the magnetic strip between two bends of the magnetic strip, and
wherein each segment of the plurality of segments includes no more than one crossing of the plurality of crossings.

6. The MTC sensor of claim 1, further comprising:
an integrated magnetic concentrator (IMC) layer configured on or formed as a part of the MTC sensor to be situated between at least a part of the magnetic strip and the magnet.

7. A multi-turn counter (MTC) sensor comprising:
a magnetic strip comprising:
  a domain wall generator located at a first end of the magnetic strip,
    the domain wall generator to generate at least one domain wall in the magnetic strip,
      wherein the at least one domain wall is configured to propagate based on a magnetic field caused by a magnet, and
      wherein a location of the at least one domain wall indicates a turn count of the magnetic field of the magnet,
        the turn count to indicate one or more of a predefined fraction of a full rotation of the magnetic field;

an end tip located at a second end of the magnetic strip,
    wherein the second end of the magnetic strip is opposite the first end;
a plurality of overlapping strip turns that cause a plurality of crossings in the magnetic strip,
    wherein a width of the magnetic strip gradually decreases over a first grading length of the magnetic strip as the magnetic strip approaches each crossing of the plurality of crossings, and
    wherein the width of the magnetic strip gradually increases over a second grading length of the magnetic strip after the magnetic strip goes through each crossing of the plurality of crossings; and
a plurality of phase delaying bends to cause a delay of propagation of the at least one domain wall with regard to an orientation of the magnetic field based on a rotation of the magnetic field.

8. The MTC sensor of claim 7, wherein at least one of the plurality of phase delaying bends causes the at least one domain wall to propagate across a crossing, of the plurality of crossings, and prevents the at least one domain wall from turning at the crossing.

9. The MTC sensor of claim 8, wherein a reduced width of the magnetic strip at the crossing is between 50% and 90% of an original width of the magnetic strip, and
    wherein the first grading length of the magnetic strip is at least twice the original width of the magnetic strip.

10. The MTC sensor of claim 7, wherein, when the domain wall is located at a first phase delaying bend of the plurality of phase delaying bends, the first phase delaying bend is configured to cause a delay in propagation of the domain wall to a second phase delaying bend, of the plurality of phase delaying bends, based on a delay structure in the magnetic strip within the first phase delaying bend,
    wherein the delay structure is configured to correspond to a direction of the magnetic field to cause the domain wall to propagate from the first phase delaying bend to the second phase delaying bend.

11. The MTC sensor of claim 7, wherein, after a partial rotation of the magnetic field, at least one of the plurality of phase delaying bends prevents the at least one domain wall from propagating to another of the plurality of phase delaying bends,
    where the partial rotation is less than a threshold rotation to cause the at least one domain wall to propagate to another of the plurality of phase delaying bends.

12. The MTC sensor of claim 7, further comprising:
an integrated magnetic concentrator (IMC) layer configured on or formed as a part of the MTC sensor to be situated between at least a part of the magnetic strip and the magnet.

13. A multi-turn counter (MTC) sensor comprising:
a magnetic strip comprising:
    a domain wall generator located at a first end of the magnetic strip,
    an end tip located at a second end of the magnetic strip, the second end of the magnetic strip being opposite the first end, and
    a plurality of overlapping strip turns between the domain wall generator and the end tip, that cause a plurality of crossings in the magnetic strip,
        wherein a width of the magnetic strip gradually decreases over a grading length of the magnetic strip as the magnetic strip approaches each crossing of the plurality of crossings, and
        wherein the width of the magnetic strip gradually increases over the grading length of the magnetic strip after the magnetic strip goes through each crossing of the plurality of crossings; and
an integrated magnetic concentrator (IMC) layer configured between at least a part of the magnetic strip and a magnet that causes a magnetic field,
    wherein the IMC is to reduce a strength of the magnetic field to enable the MTC sensor to count a number of rotations of the magnet based on detecting movement of domain walls in the magnetic strip caused by the magnetic field.

14. The MTC sensor of claim 13, wherein the IMC layer is configured to be situated between the magnet and the end tip.

15. The MTC sensor of claim 13, wherein the IMC layer is configured to be situated between the magnet and the magnetic strip and the IMC layer is configured to be omitted between the magnet and the domain wall generator.

16. The MTC sensor of claim 13,
    wherein the IMC layer is configured to be situated between the magnet and each crossing of the plurality of crossings.

17. The MTC sensor of claim 13, wherein the plurality of overlapping strip turns comprise at least one phase delaying bend.

18. The MTC sensor of claim 13, wherein the IMC layer comprises a permeable film formed from at least one of a cobalt, iron, or nickel alloy.

19. The MTC sensor of claim 7, wherein the first grading length is different than the second grading length.

20. The MTC sensor of claim 7, wherein the first grading length and the second grading length are the same.

* * * * *